(12) United States Patent
Fang et al.

(10) Patent No.: US 8,927,306 B2
(45) Date of Patent: Jan. 6, 2015

(54) ETCHED-FACET LASERS HAVING WINDOWS WITH SINGLE-LAYER OPTICAL COATINGS

(71) Applicant: Avago Technologies General IP (Singapore) Pte. Ltd., Singapore (SG)

(72) Inventors: Ruiyu Fang, Turin (IT); Giuliana Morello, Turin (IT); Giammarco Rossi, Turin (IT); Roberto Paoletti, Turin (IT); Alessandro Stano, Turin (IT); Giancarlo Meneghini, Turin (IT)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 13/781,129

(22) Filed: Feb. 28, 2013

(65) Prior Publication Data
US 2014/0239250 A1   Aug. 28, 2014

(51) Int. Cl.
*H01L 21/00*     (2006.01)
*H01L 33/06*     (2010.01)

(52) U.S. Cl.
CPC ...................................... *H01L 33/06* (2013.01)
USPC ........................................................... 438/29

(58) Field of Classification Search
CPC ...................................................... H01L 33/06
See application file for complete search history.

(56) References Cited

U.S. PATENT DOCUMENTS

| | | | |
|---|---|---|---|
| 6,289,030 B1 * | 9/2001 | Charles | 372/49.01 |
| 6,878,565 B2 | 4/2005 | Thiyagarajan | |
| 7,873,089 B2 | 1/2011 | Chen | |
| 2008/0191223 A1 | 8/2008 | Nakamura et al. | |
| 2011/0080929 A1 | 4/2011 | Onozawa et al. | |
| 2012/0183007 A1 | 7/2012 | Roggero et al. | |
| 2012/0195336 A1 | 8/2012 | Fang et al. | |
| 2012/0281727 A1 | 11/2012 | Fang et al. | |

OTHER PUBLICATIONS

Yang, et al., "Transfer-printed stacked nanonmembrane lasers on silicon," Nature Photonics, Jul. 2012.

Vettiger, et al., "Full-Wafer Technology—A New Approach to Large-Scale Laser Fabrication and Integration," IEEE Journal of Quantum Electronics, vol. 27(6), Jun. 1991, pp. 1319-1331.

Horst, et al., "High-Reflectance Dielectric Mirrors Deposited by Plasma-Enhanced Chemical Vapor Deposition on GaAs—AlGaAs Semiconductor Lasers with Inductively Coupled Plasma Etched Facets," IEEE Photonics Technology Letters, vol. 12(10), Oct. 2000, pp. 1325-1327.

* cited by examiner

*Primary Examiner* — Kevin M Picardat
*Assistant Examiner* — Paul Patton

(57) ABSTRACT

An edge-emitting etched-facet optical semiconductor structure has a substrate, an active multiple quantum well (MQW) region formed on the substrate, and a ridge waveguide formed over the MQW region extending in substantially a longitudinal direction between a waveguide first etched end facet and a waveguide second etched end facet. A mask layer used to form windows in which the etched end facets are disposed consists of a single dielectric material disposed directly on the ridge waveguide. An optical coating consisting of no more than one layer of the same dielectric material of which the second mask is made is disposed directly on the second mask and disposed directly on the windows to coat the etched end facets.

20 Claims, 13 Drawing Sheets

= FIRST MASK (SiO2)

///// = SECOND MASK
       (SiNx)

///// = SECOND MASK (SiNx)

\\\\\ = OPTICAL COATING
       (SiNx)

= SECOND MASK (SiNx)

= OPTICAL COATING (SiNx)

= SECOND MASK (SiNx)

= OPTICAL COATING (SiNx)

ETCHED-FACET LASERS HAVING WINDOWS WITH SINGLE-LAYER OPTICAL COATINGS

BACKGROUND

Optical transceivers are key components in optical fiber-based telecommunications and data communication networks. An optical transceiver includes an opto-electronic light source, such as a laser, and an opto-electronic light receiver, such as a photodiode, and may also include various electronic circuitry associated with the laser and photodiode. For example, driver circuitry can be included for driving the laser in response to electronic signals received from the electronic system. Receiver circuitry can be included for processing the signals produced by the photodiode and providing output signals to the electronic system. Optical lenses are also commonly included.

Generally, there are two types of semiconductor laser devices: edge-emitting lasers and Vertical Cavity Surface Emitting Lasers (VCSELs). An advantage of VCSELs is that they can be tested economically at wafer level rather than chip level. Another advantage of VCSELs is their well-defined spot size, which promotes high coupling efficiency to optical fibers without the need to provide beam shape correction, thus facilitating economical packaging. Edge-emitting lasers also have advantages, such as robust reliability and high output optical power. Likely for these reasons, edge-emitting lasers remain the most commonly used semiconductor laser in high-speed optical transceivers. To test edge-emitting lasers, a wafer must be scribed and cleaved for single-chip testing. That is, wafers must be diced into bars, coated with highly-reflective (HR) or anti-reflective (AR) coatings, and then diced to single chips to be tested and selected. The process of testing edge-emitting lasers thus can be relatively uneconomical.

One way to reduce edge-emitting laser chip cost involves a process commonly referred to as etched facet. In an etched facet laser, the feedback mirrors are etched facets rather than cleaved facets. Etched facets facilitate coating the facet with highly reflective or, alternatively, anti-reflective layers at wafer-level, rather than at bar level. (See, e.g., Peter Vettiger, et al., IEEE Journal of Quantum Electronics, Vol. 27(6), June 1991, p. 1319.) A mirror-like etching profile is necessary to minimize reflection loss and provide a uniform coating thickness.

Edge-emitting lasers can have either a ridge waveguide structure or a buried waveguide structure. The process of fabricating a ridge waveguide structure is less complex than the process of fabricating a buried waveguide structure. For uncooled lasers, the active core layers are commonly made of aluminum-containing multiple quantum well (MQW) layers. In such a laser, a ridge waveguide structure is more advantageous than a buried waveguide structure because a ridge waveguide structure does not have an etched MQW region or suffer from aluminum oxidation.

The facets in an etched-facet laser are commonly etched by an inductively coupled plasma (ICP) process using a protection mask. This process is carried out after the formation of the waveguide. However, the presence of the ridge in such a ridge waveguide structure introduces two main difficulties for fabricating such a laser: facet quality and facet coating (particularly with regard to facet coating thickness).

With regard to the issue of facet quality in fabricating ridge waveguide lasers, it is almost impossible to have a smooth mirror-like etch profile on a ridge waveguide structure because the mask edge in the ICP process is disturbed by the non-planar ridge structure. The quality of facets produced in the ICP process depends strongly on mask profile. In S. C. Horst, et al., "High-reflectance dielectric mirrors deposited by Plasma-Enhanced Chemical Vapor Deposition on GaAs—AlGaAs Semiconductor Lasers with Inductively Coupled Plasma Etched Facets," IEEE Photonics technology Letters, VOL. 12 (10), October 2000, p 1325-1327, a Benzocyclobuten (BCB) layer was used to first planarize the ridge, and then an SiO2 mask was deposited and defined on the BCB layer.

A key feature of the above-described process is a BCB etch-back process that transfers a non-planar ridge to a planar surface. However, the process is rather complicated and time-consuming, requiring a number of steps: BCB coating, thermal curing, and BCB etch-back, followed by SiO2 layer deposition, photolithography, SiO2 dry etch, ICP etch, and lastly removal of the BCB coating. It is difficult to provide a vertical mask profile such that the ICP etch process results in a vertical ridge profile. Furthermore, the removal of BCB residue can be problematic.

The other major issue in fabricating etched facet lasers with ridge waveguide relates to facet coating and, in particular, facet coating thickness control. For proper laser operation, either a highly reflective (HR) coating for Fabry-Perot (FP) lasers or an anti-reflective (AR) coating for Distributed Feedback (DFB) lasers must be applied. Such coatings are commonly applied by depositing SiO2/SiNx layer pairs on an entire wafer by Plasma-Enhanced Chemical Vapor Deposition (PECVD). However, the non-planar ridge structure causes a "shadowing effect," which inhibits precise control of coating layer thickness near the ridge. For proper DFB laser operation, an AR coating layer having a ¼-wavelength thickness (or odd multiple thereof) is commonly applied.

As illustrated in FIGS. 1-3 (not to scale), a known ridge waveguide laser structure 10 includes etched windows 12 fabricated directly on the structure using a protection mask (not shown). The term "window" refers to a region etched down from the surface to the substrate. As described in further detail below, the facets defined by windows 12 are coated with either an HR or AR coating material, depending on whether the resulting structure is to be an FP laser or DFB laser. In this fabrication process, the "shadowing effect" of the ridge structure 14 commonly adversely impacts mask definition, ICP etch, and facet coating.

Multi-mask layers (not shown) are commonly used to fabricate a structure such as ridge structure 14 over an MQW layer 7. The first mask, which can be a BCB layer, is used with an etch-back process to planarize the ridge. Then, an SiO2 mask is deposited on the BCB surface. However, such a double mask hampers providing a vertical mask profile, which is fundamental to obtaining a vertical etch profile using the ICP process. Furthermore, such a multi-mask process is rather complicated and time-consuming, involving a number of steps: BCB coating, thermal curing, etch-back, SiO2 deposition on BCB, photolithography, reactive ion etching (RIE) SiO2 etch, BCB etch, ICP semiconductor etch, SiO2 removal, BCB removal, and facet coating. The last step before facet coating, i.e. removing the BCB layer, is often not completely effective, thus leaving BCB residues that hamper SiO2 or metal adhesion.

To provide good anti-reflective properties, the facets defined by windows 12 are commonly coated with one or more pairs of SiO2 and SiNx layers. Portions 9 and 19 of FIGS. 2A and 3A, respectively, are shown enlarged in FIGS. 2B and 3B. As illustrated in FIGS. 2B and 3B, the AR coating material can comprise, for example, two SiO2/SiNx coating layer pairs, i.e., four coating layers: a bottom or first coating layer 11 of SiNx; a second coating layer 13 of SiO2 over first coating layer 11; a third coating layer 15 of SiNx over second coating layer 13; and a top or fourth coating layer 17 of SiO2 over third coating layer 15. The total or combined thickness of the SiO2/SiNx coating layer pairs is commonly selected to be an odd multiple of ¼ wavelength and to be thick enough to help minimize parasitic capacitance. For these reasons, it is not uncommon to have two SiO2/SiNx coating layer pairs rather than only a single SiO2/SiNx coating layer pair.

Although such a 4-layer coating can advantageously provide good anti-reflective properties and low parasitic capacitance, such a 4-layer coating can pose problems for further device fabrication steps. In fabricating a DFB laser, further fabrication steps commonly include forming an electrical contact window on ridge structure 14 and applying a metal region to the electrical contact window. Reactive ion etching (RIE) is commonly used to form the electrical contact window. Because the RIE process etches SiO2 and SiNx coatings at different rates, the RIE process can leave the etched coating surface with a furrowed texture, as illustrated in FIG. 2C. This furrowed surface texture can cause layers to peel away from each other or otherwise hamper metal adhesion.

It would be desirable to provide a ridge semiconductor laser with high facet quality facet, stable facet coating yield, low parasitic capacitance, optimized coating design, and minimal fabrication challenges.

SUMMARY

Embodiments of the present invention relate to an edge-emitting optical semiconductor device that includes a substrate, an multiple quantum well (MQW) region formed on the substrate, and a ridge waveguide extending in substantially a longitudinal direction between a waveguide first etched end facet disposed in a first window and a waveguide second etched end facet disposed in a second window. The ridge waveguide is formed on a surface of the substrate over the MQW region. The first and second windows extend in a depth direction from the ridge waveguide to the substrate and through the MQW region. The mask layer consists of a single dielectric material disposed directly on the ridge waveguide. The edge-emitting optical semiconductor device further has an optical coating that consists of no more than a single layer of the same dielectric material of which the second mask consists. This optical coating layer is disposed directly on the second mask and also disposed directly on the first and second windows to coat the etched end facets. The edge-emitting optical semiconductor device further includes a metal region extending in the depth direction through a contact opening in the optical coating and the mask layer, such that the metal region is in contact with a portion of the ridge waveguide.

Embodiments of the present invention also relate to a method for fabricating an edge-emitting optical semiconductor device. The method includes: forming an MQW region on a substrate; forming a first mask over the MQW region, wherein the first mask defines a first ridge waveguide region extending in substantially a longitudinal direction between a first waveguide first end and a first waveguide second end; forming a first ridge waveguide corresponding to the first ridge waveguide region; forming a second mask consisting of a single dielectric material directly on the first ridge waveguide; performing a removal process through the second mask to remove portions of the first MQW region and substrate to produce a window extending in a depth direction from the first ridge waveguide to the substrate and through the first MQW region, the window defining a first waveguide etched end facet; applying an optical coating directly on the second mask and directly on the window to coat the first waveguide etched end facet, the optical coating consisting of no more than one layer of the dielectric material of the second mask; etching a first contact opening through the optical coating and the second mask to expose the first ridge waveguide; and applying a first metal region in contact with a portion of the first ridge waveguide exposed through the first contact window.

Other systems, methods, features, and advantages will be or become apparent to one with skill in the art upon examination of the following figures and detailed description. It is intended that all such additional systems, methods, features, and advantages be included within this description, be within the scope of the specification, and be protected by the accompanying claims.

BRIEF DESCRIPTION OF THE DRAWINGS

The invention can be better understood with reference to the following drawings. The components in the drawings are not necessarily to scale, emphasis instead being placed upon clearly illustrating the principles of the present invention.

DETAILED DESCRIPTION

Figure 1:
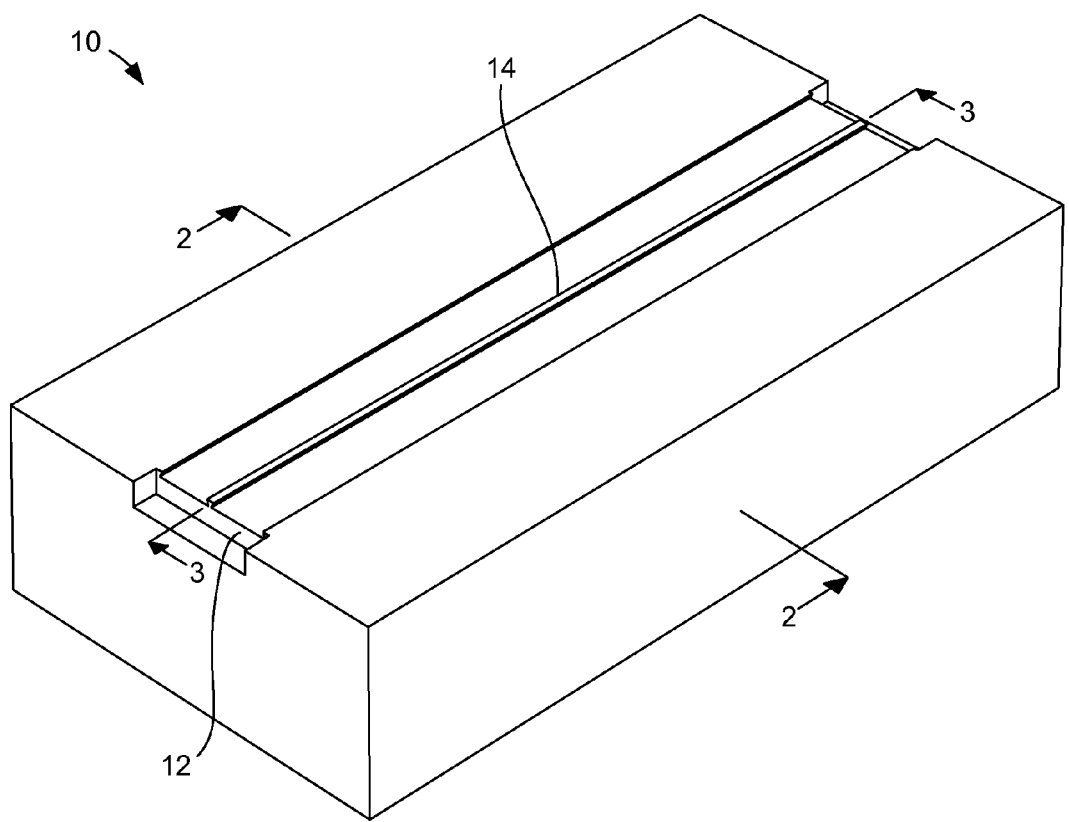
FIG. 1 is a schematic perspective view of an etched-facet ridge waveguide laser structure in accordance with the prior art.

As illustrated in FIGS. 4-7 (not to scale), in an illustrative or exemplary embodiment of the invention, an etched-facet laser structure 16 includes a first waveguide portion 18 and a second waveguide portion 20. Although for purposes of clarity only two adjoining waveguide portions 18 and 20 are described in the following exemplary embodiment, it should be understood that many such adjoining waveguide portions can be formed on a semiconductor wafer and then separated from one another.

In a manner described below, first waveguide portion 18 and second waveguide portion 20 are formed on a semiconductor substrate 22 in an orientation parallel to a major plane of substrate 22. First waveguide portion 18 includes a first ridge waveguide 24. First waveguide portion 18 further includes a first etched end facet 26 in a first window 27 at a first end of first waveguide portion 18 and a second etched end facet 28 in a second window 42 at a second end of first waveguide portion 18. First ridge waveguide 24 extends between the first and second ends of first waveguide portion 18 in a direction generally aligned with a longitudinal axis 30. The distance that first ridge waveguide 24 extends in this direction is referred to herein as its "length." The term "width" refers to a direction perpendicular to length. Note that first and second etched end facets 26 and 28 of first waveguide portion 18, which serve as end waveguides, are wider than first ridge waveguide 24. Similarly, second waveguide portion 20 includes a second ridge waveguide 32. Second waveguide portion 20 further includes a first etched end facet 34 in second window 42 at a first end of second waveguide portion 20 and a second etched end facet 36 in a third window 29 at a second end of second waveguide portion 20. Second ridge waveguide 32 extends between the first and second ends of second waveguide portion 20 in a ("length") direction generally aligned with longitudinal axis 30. Note that first and second etched end facets 34 and 36 of second waveguide portion 20, which serve as end waveguides, are wider than second ridge waveguide 32. First and second etched end facets 26 and 28 of first waveguide portion 18 and first and second etched end facets 34 and 36 of second waveguide portion 20 are all coated with a single-layer optical coating, as described below in further detail.

With the above-described arrangement, the etched facet window is on a planar surface instead of on a reverse ridge. This enables a smooth vertical etching profile using a dielectric (e.g., SiO2 or SiNx) mask. A smooth vertical etching profile is important to enable a laser device to supply optical feedback. Also, by avoiding a ridge "shadowing effect," deposition of the coating layers can be easily controlled.

Figure 6:
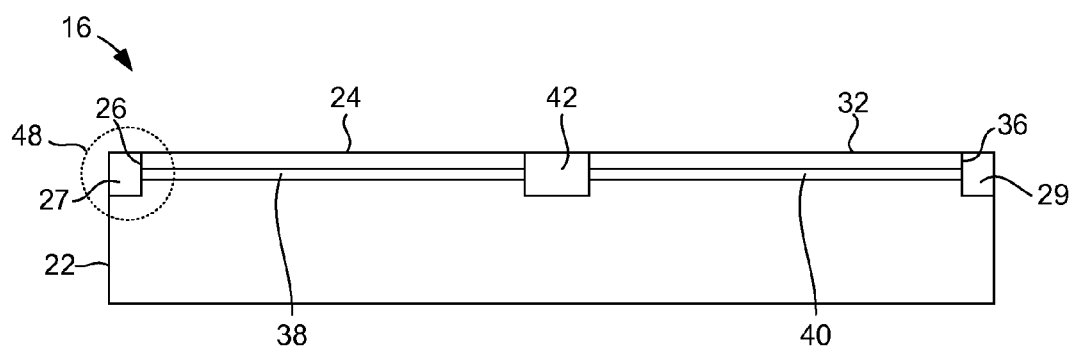
FIG. 6 is a sectional view along line 6-6 of FIG. 5.
Figure 7:
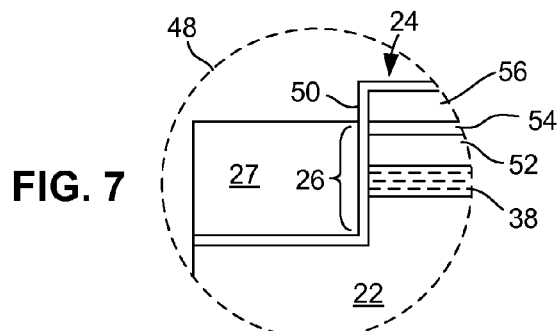
FIG. 7 is an enlargement of a region of FIG. 6.

Note in FIGS. 6-7 that first and second ridge waveguides 24 and 32 are formed above one or more active multiple quantum well (MQW) layers 38 and 40. Although active MQW layers 38 and 40 are described individually for purposes of clarity, they can be portions or regions of the same layer structure. When semiconductor structure 16 is in operation, active MQW layers 38 and 40 produce gain or absorption according to device functionality, as well understood by persons skilled in the art.

Windows 27, 42 and 29 extend from ridge waveguides 24 and 32 through active MQW layers 38 and 40 down to substrate 22. First window 27 includes a first window pair of alcoves 37. First etched end facet 26 of first waveguide portion 18 extends between the first window pair of alcoves 37 and thus defines the width of first etched end facet 26 of first waveguide portion 18. Second window 42 includes a second window first pair of alcoves 44 and a second window second pair of alcoves 46. Second etched end facet 28 of first waveguide portion 18 extends between the second window first pair of alcoves 44 and thus defines the width of second etched end facet 28 of first waveguide portion 18. First etched end facet 34 of second waveguide portion 20 extends between the second window second pair of alcoves 46 and thus defines the width of first etched end facet 34 of second waveguide portion 20. It can be noted the second window first pair of alcoves 44 and second window second pair of alcoves 46, which are disposed generally opposite the second window first pair of alcoves 44, together provide second window 42 with a shape resembling the letter "H". Second etched end facet 28 of first waveguide portion 18 is disposed across from or opposite first etched end facet 34 of second waveguide portion 20 within the H-shaped second window 42. Third window 29 includes a third window pair of alcoves 39. Second etched end facet 36 of second waveguide portion 20 extends between the third window pair of alcoves 39 and thus defines the width of second etched end facet 36 of second waveguide portion 20.

The function of each alcove pair is to define a wide end ridge that accordingly provides a broad spot-size to help minimize the possibility of catastrophic optical damage on a facet. Furthermore, the alcoves together with the whole-facet window provide an effective isolation of active MQW layers for each chip, thus making possible on-wafer measurement.

A portion 48 of FIG. 6 relating to first ridge waveguide 24 and first window 27 is shown enlarged in FIG. 7. As illustrated in FIG. 7, first etched end facet 26 is coated with an optical coating 50 consisting of exactly one layer of a dielectric optical coating compound, such as, for example, SiNx. Optical coating 50 coats not only etched end facets 26, 28, 34 and 36, but also the upper surface of the semiconductor material stack that characterizes semiconductor structure 16. For purposes of clarity, only active MQW layers 38 and 40 are shown in FIG. 6. However, the further detail revealed in the enlarged portion 48 (FIG. 7) shows that the semiconductor material stack includes not only active MQW layer 38 but also an InP layer 52 directly on top of MQW layer 38 as well as an InGaAs layer 54 directly on top of InP layer 52. (As used herein in the context of the semiconductor material stack, the word "directly" means without any intervening layers.) For fabrication reasons described below, a mask layer 56 that, like optical coating 50, consists solely of a single dielectric compound such as, for example, SiNx, is disposed directly on top of InGaAs layer 54 and directly beneath optical coating 50. Note that optical coating 50 is deposited directly on top of mask layer 56 that consists of the same material as optical coating 50, as described in further detail below with regard to a fabrication method.

Figure 8:
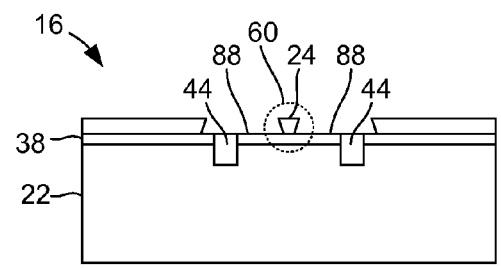
FIG. 8 is a sectional view along line 8-8 of FIG. 5.
Figure 9:
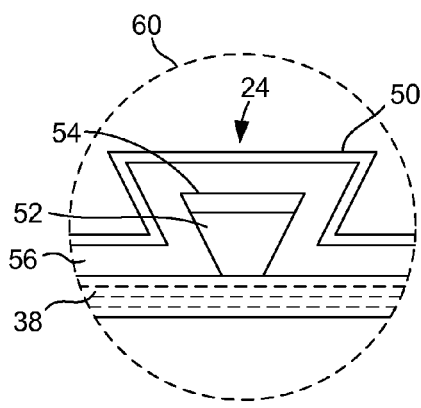
FIG. 9 is an enlargement of a region of FIG. 8.

An enlarged portion 60 of FIG. 8 is shown in FIG. 9. As illustrated in FIG. 9, first ridge waveguide 24 comprises InP layer 52 and InGaAs layer 54. Note that due to the manner by which first ridge waveguide 24 is formed, mask layer 56 is disposed directly on top of active MQW layer 38 and directly beneath optical coating 50. Second ridge waveguide 32 is not similarly shown in section in the manner of first ridge waveguide 24 because second ridge waveguide 32 has the same structure (e.g., semiconductor material stack) as first ridge waveguide 24.

Figure 10:
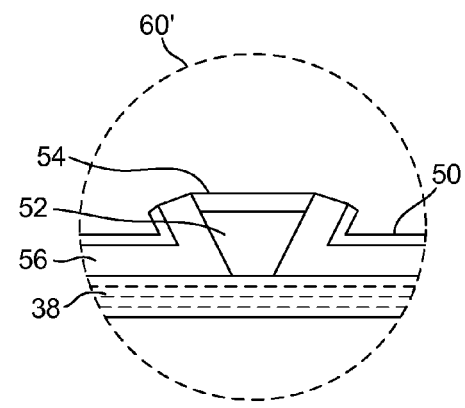
FIG. 10 is similar to FIG. 9, showing the region following further processing.

As described below with regard to a further fabrication step, regions of mask layer 56 and optical coating 50 are removed to expose InGaAs layer 54, which serves as an electrical contact layer. As illustrated in FIG. 10, an enlargement 60' similar to enlarged portion 60 (FIG. 9) shows the exposed portions of InGaAs layer 54 along with exposed portions of mask layer 56 and optical coating 50 after this further fabrication step.

Figure 11:
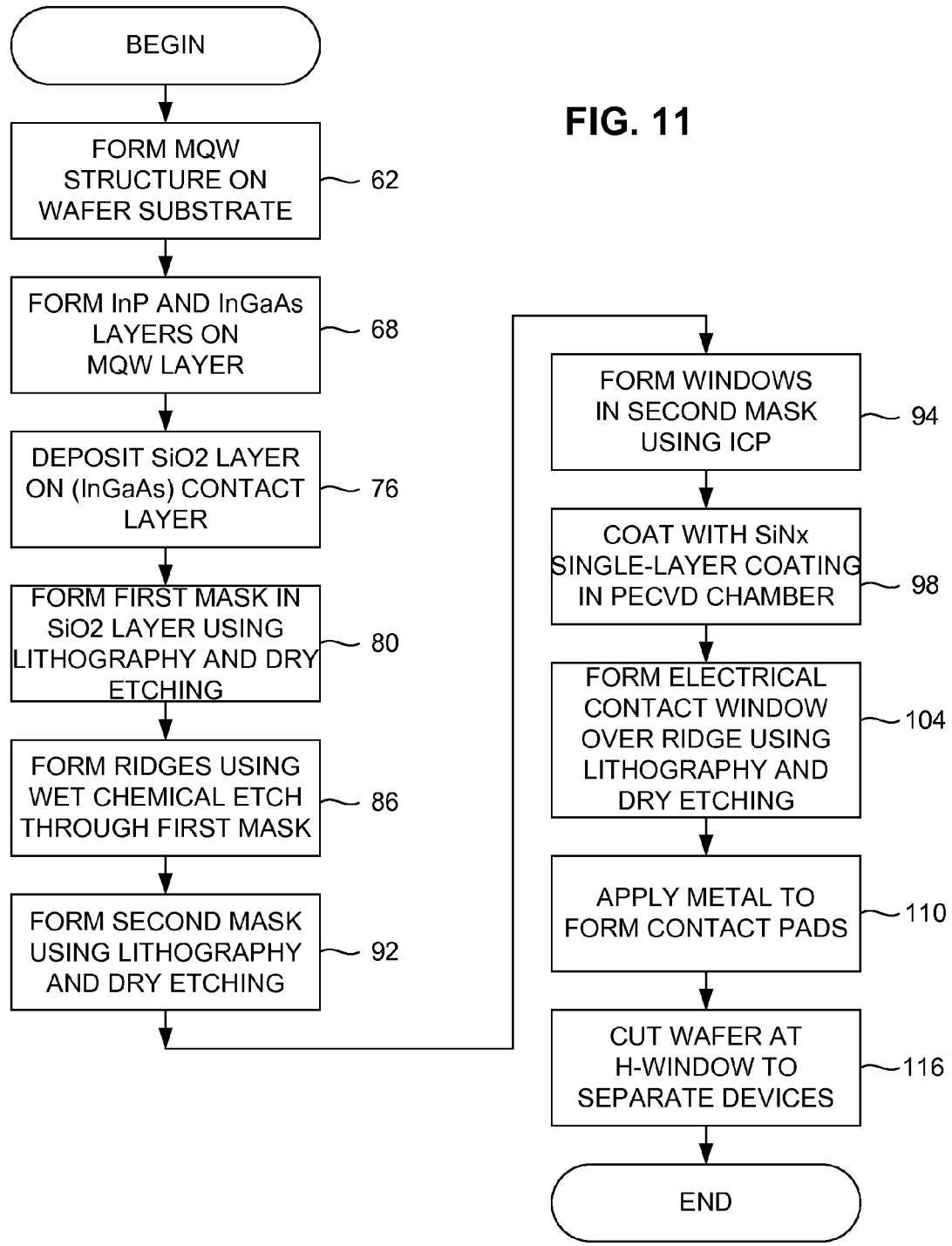
FIG. 11 is a flow diagram illustrating an exemplary method for fabricating etched-facet lasers.

A method for fabricating the above-described edge-emitting optical semiconductor structure 16 and similar structures is illustrated in FIG. 11 and described with further reference to FIGS. 12-21. Although not shown for purposes of clarity, it should be understood that the method can be performed on a semiconductor wafer having many such structures.

Figure 12:
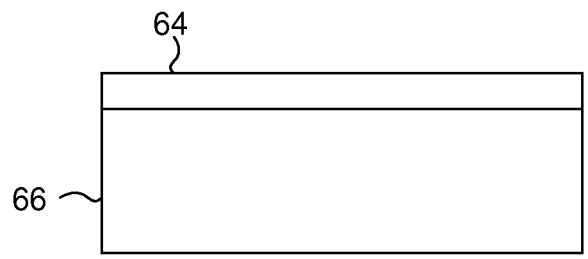
FIG. 12 illustrates a first step in the exemplary method for fabricating etched-facet lasers.

As indicated by block 62, and with further reference to FIG. 12, one or more MQW layers 64 are formed on a substrate 66. Substrate 66 is made of a suitable semiconductor material such as indium phosphide (InP). Note that in an edge-emitting optical semiconductor device having first and second waveguide portions, corresponding first and second MQW regions are provided. Although InP is used in this exemplary embodiment, it should be understood that in other embodiments other materials can be used for substrate 66 or other layers, including materials such as gallium arsenide (GaAs), aluminum gallium arsenide (AlGaAs), aluminum gallium indium arsenide (AlGaInAs), etc. Persons skilled in the art will be readily capable of selecting suitable materials in view of the teachings herein. Unless stated otherwise, a layer described as being formed on or over another layer is formed directly on the other layer.

Figure 13:
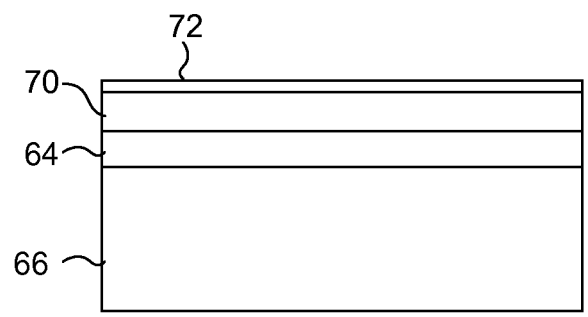
FIG. 13 illustrates a second step in the exemplary method for fabricating etched-facet lasers.

As indicated by block 68, and with further reference to FIG. 13, an InP layer 70 and an InGaAs layer 72 are formed over MQW layers 64.

Figure 14:
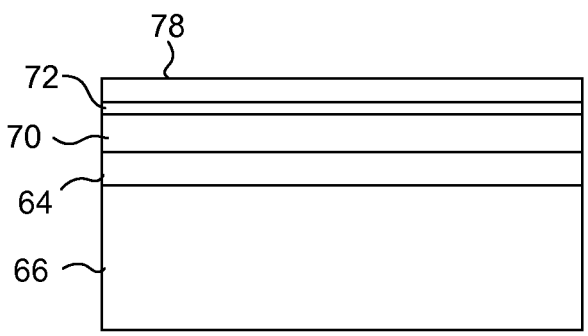
FIG. 14 illustrates a third step in the exemplary method for fabricating etched-facet lasers.
Figure 15:
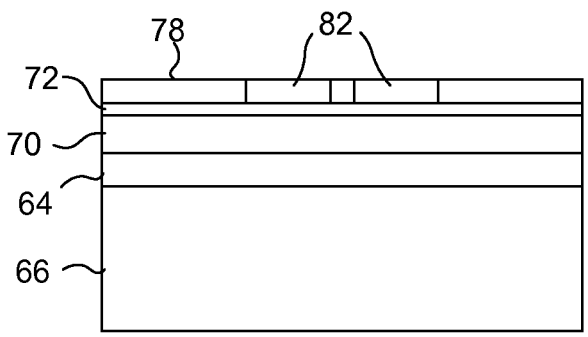
FIG. 15 illustrates a fourth step in the exemplary method for fabricating etched-facet lasers.
Figure 16:
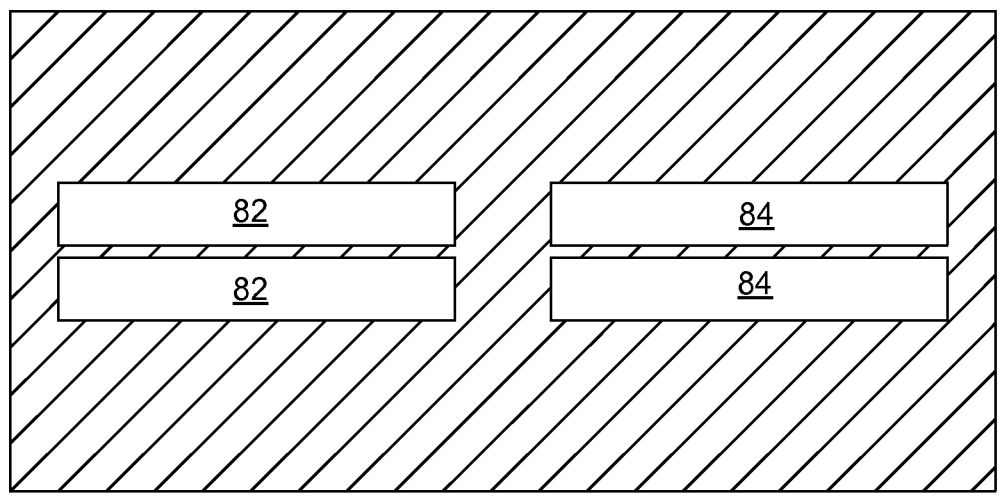
FIG. 16 is a schematic plan view showing the first mask in the exemplary fabrication method.

As indicated by block 76, and with further reference to FIG. 14, a first mask layer 78 of, for example, SiO2 is formed over InGaAs layer 72. As indicated by block 80, and with further reference to FIGS. 15 and 16, a first mask is formed in first mask layer 78 by using lithography and dry-etch to remove first and second ridge waveguide regions 82 and 84. In FIG. 16, the hatched regions represent the SiO2 or other first mask material, and the non-hatched regions represent openings (i.e., first and second ridge waveguide regions 82 and 84) through the first mask. The first mask thus defines first and second ridge waveguide regions 82 and 84.

Figure 17:
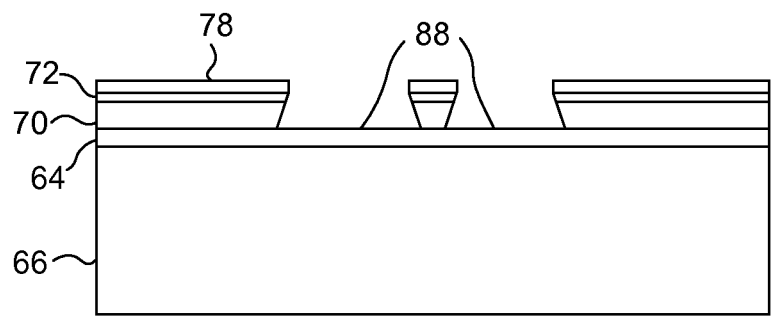
FIG. 17 illustrates a fifth step in the exemplary method for fabricating etched-facet lasers.
Figure 18:
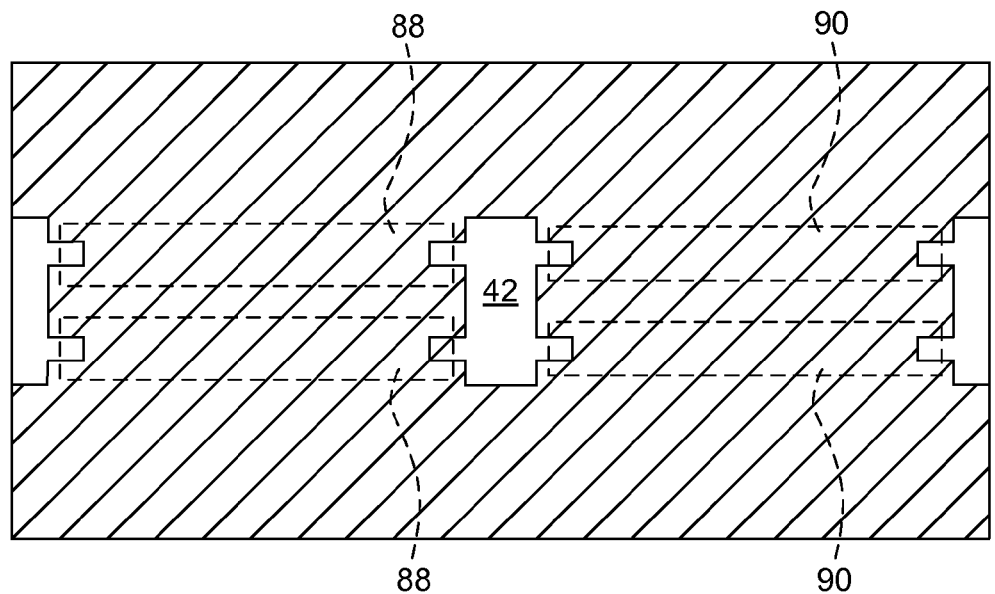
FIG. 18 illustrates a sixth step in the exemplary method for fabricating etched-facet lasers.

As indicated by block 86, and with further reference to FIG. 17, a wet chemical etch can be used to etch the first mask (through first and second ridge waveguide regions 82 and 84) to form first and second ridge waveguides corresponding to the first and second ridge waveguide regions 82 and 84. The first and second ridge waveguides are delineated by pairs of recessed regions 88 and 90, respectively (FIGS. 17-18). Note that the first and second ridge waveguides are formed over the first and second MQW regions, respectively. The first mask is then removed by, for example, wet chemical etching.

As indicated by block 92, and with further reference to FIG. 18, a second mask is formed by depositing a layer of dielectric material, such as, for example, SiNx, over the resulting first and second waveguide portions and using lithography and dry etching. As indicated by block 94, a material removal process such as an inductively coupled plasma (ICP) process is used to remove an H-shaped region to form the above-described window 42. In FIG. 18, the hatched regions represent the second mask material, and the non-hatched regions represent windows 42 (and portions thereof) etched by this ICP process. (For purposes of clarity, only one such window 42 and portions of two other such windows are shown.) The ICP etching process is performed to a depth down to the substrate, such that the MQW layer is removed. The mirror-like etching profiles are useful to supply optical feed-back for laser device.

Figure 19:
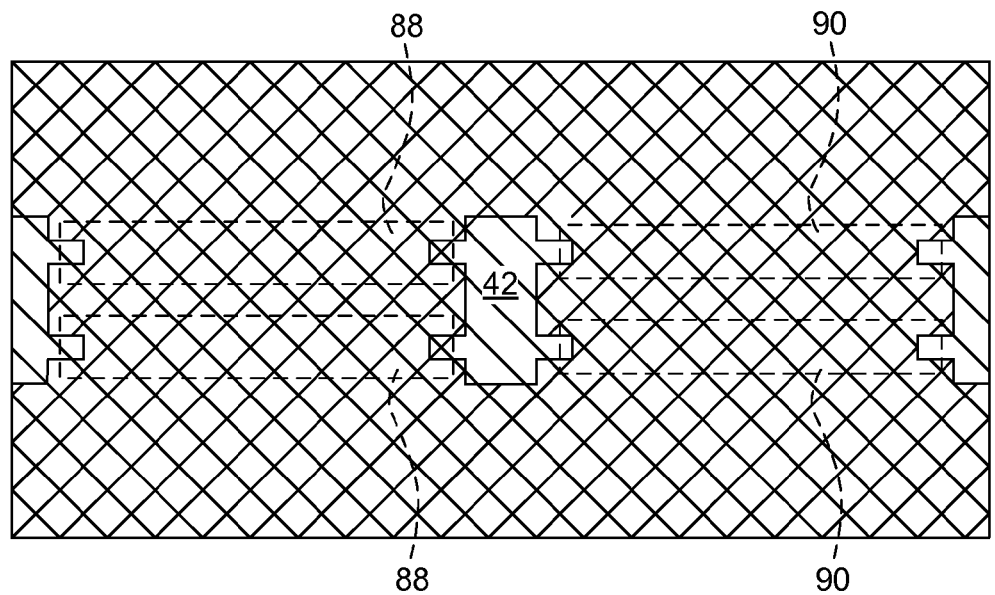
FIG. 19 illustrates a seventh step in the exemplary method for fabricating etched-facet lasers.

As illustrated by block 98, and with further reference to FIG. 19, a single layer of a dielectric optical coating material, such as, for example, SiNx, is applied to the resulting structure, such that the etched facets 28 and 34 in window 42 are coated. For example, the structure (or wafer having many of such structures) can be placed in a Plasma-Enhanced Chemical Vapor Deposition (PECVD) chamber. An SiNx coating material can be applied in this manner in an instance in which the method is used to fabricate a DFB laser. In an instance in which the method is used to fabricate an FP laser, another suitable coating material can be applied. Note that the optical coating material should consist of the same compound as the second mask material.

Figure 20:
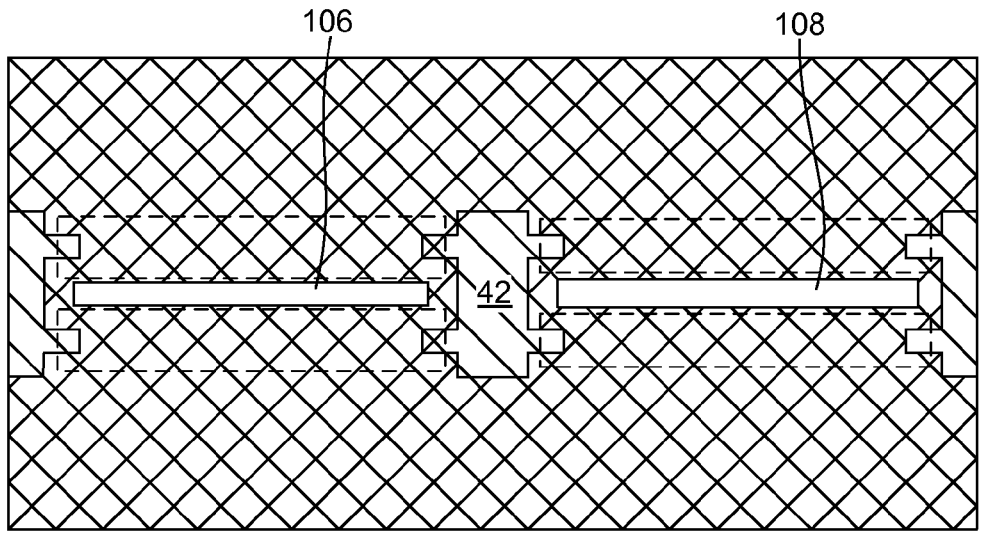
FIG. 20 illustrates a eighth step in the exemplary method for fabricating etched-facet lasers.

As illustrated by block 104, and with further reference to FIG. 20, electrical contact opening windows are formed by lithography and dry etching. Accordingly, both the coating and the second mask are etched off in regions 106 and 108 along portions of the first and second ridge waveguides. The result of such etching is shown in FIG. 10. Note the absence of a furrowed surface in FIG. 10 compared with the conventional result shown in FIG. 2C in which the structure has a multi-layer optical coating. The absence of a furrowed surface promotes good adhesion of metal in the next process step.

Figure 21:
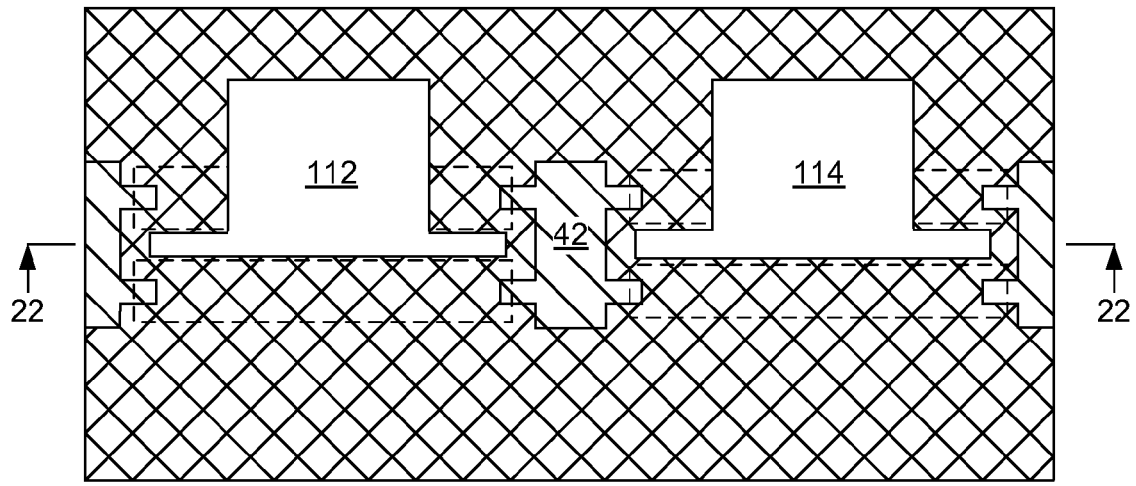
FIG. 21 illustrates a ninth step in the exemplary method for fabricating etched-facet lasers.

As illustrated by block 110, and with further reference to FIG. 21, metal regions 112 and 114 (e.g., Ti/Pt/Au) is applied to regions 106 and 108 by, for example, a liftoff or sputtering process. In regions 106 and 108 metal 112 and 114, respectively, contact the InGaAs layer 54 (FIG. 10) of the ridge waveguides. As well understood by persons skilled in the art, each of metal regions 112 and 114 serves as one of the electrical contact pads of a laser.

Figure 2A:
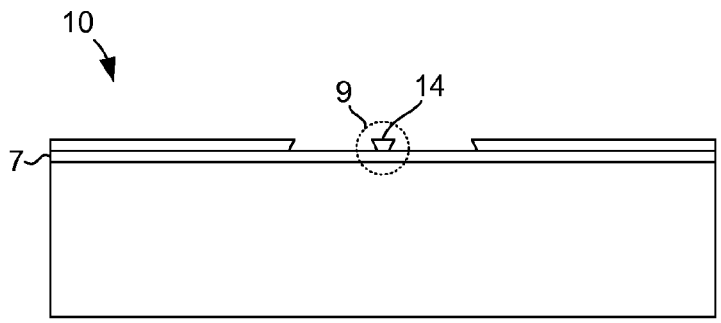
FIG. 2A is a sectional view along line 2-2 of FIG. 1.
Figure 2B:
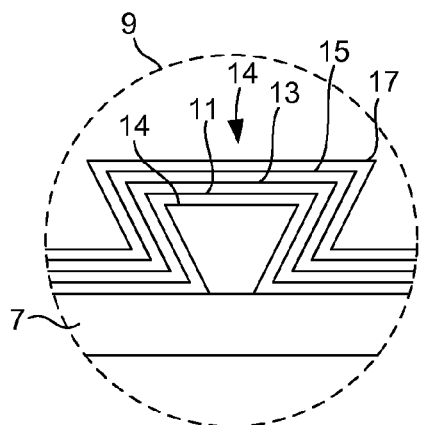
FIG. 2B is an enlargement of a region of FIG. 2A.
Figure 2C:
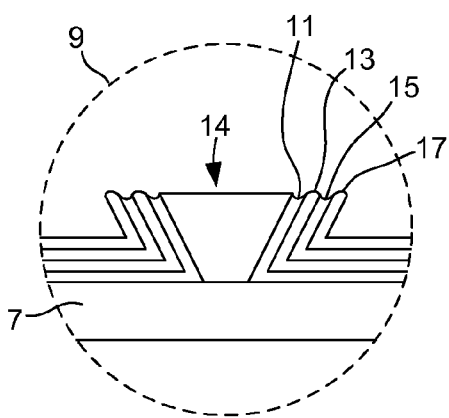
FIG. 2C is similar to FIG. 2B, showing the region following further processing.
Figure 3A:
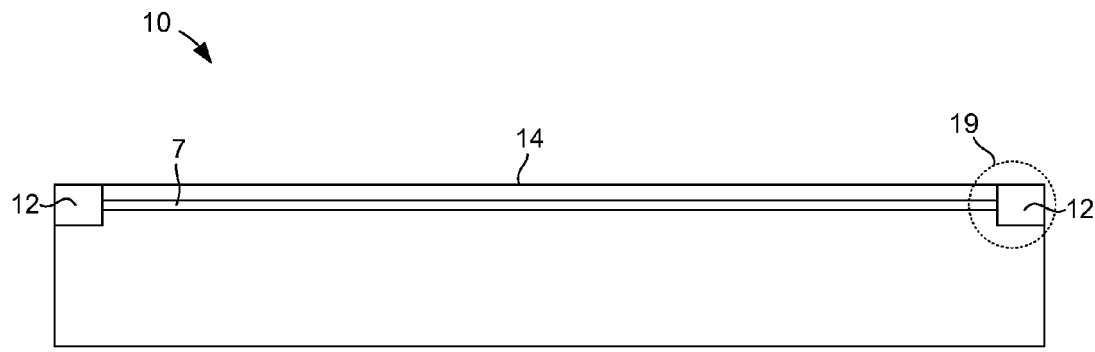
FIG. 3A is a sectional view along line 3-3 of FIG. 1.
Figure 3B:
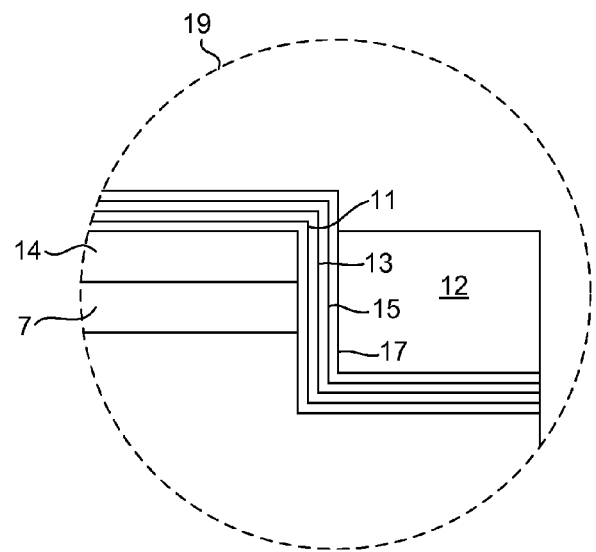
FIG. 3B is an enlargement of a region of FIG. 3A.
Figure 4:
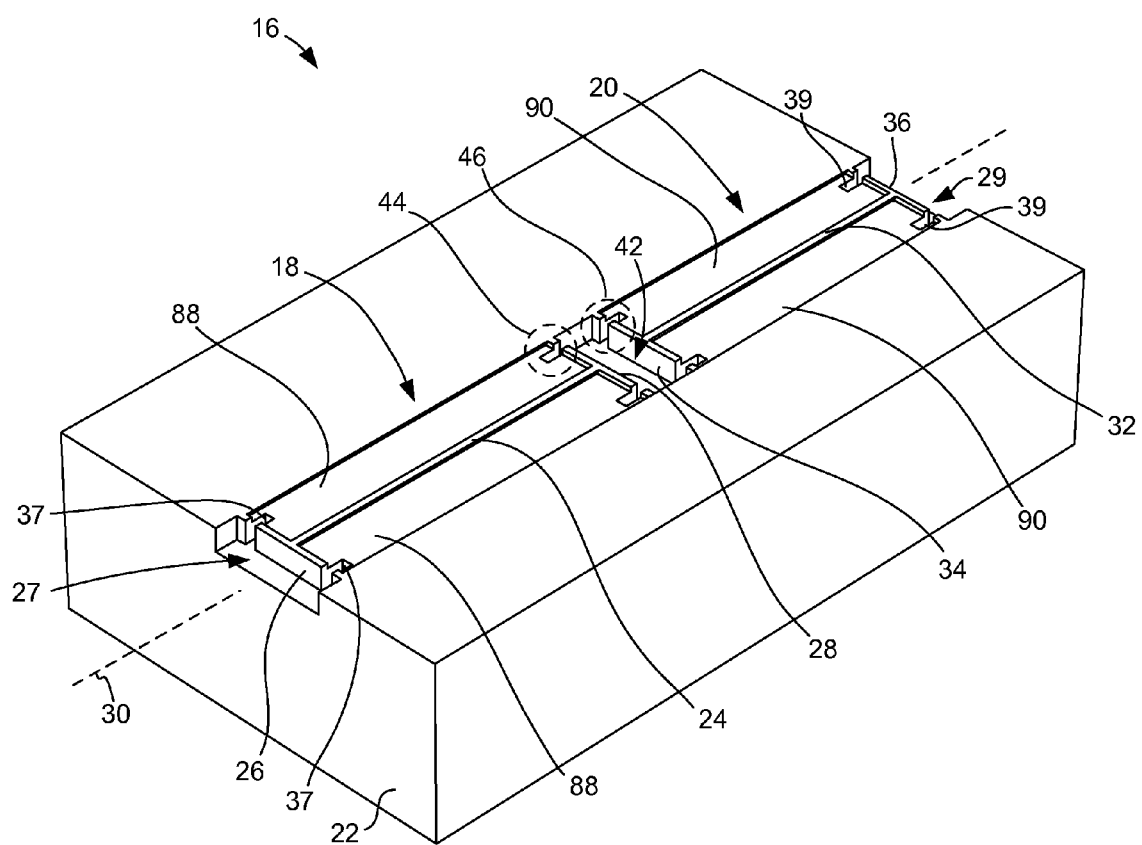
FIG. 4 is a schematic perspective view of an etched-facet laser structure in accordance with an exemplary embodiment of the present invention.
Figure 5:
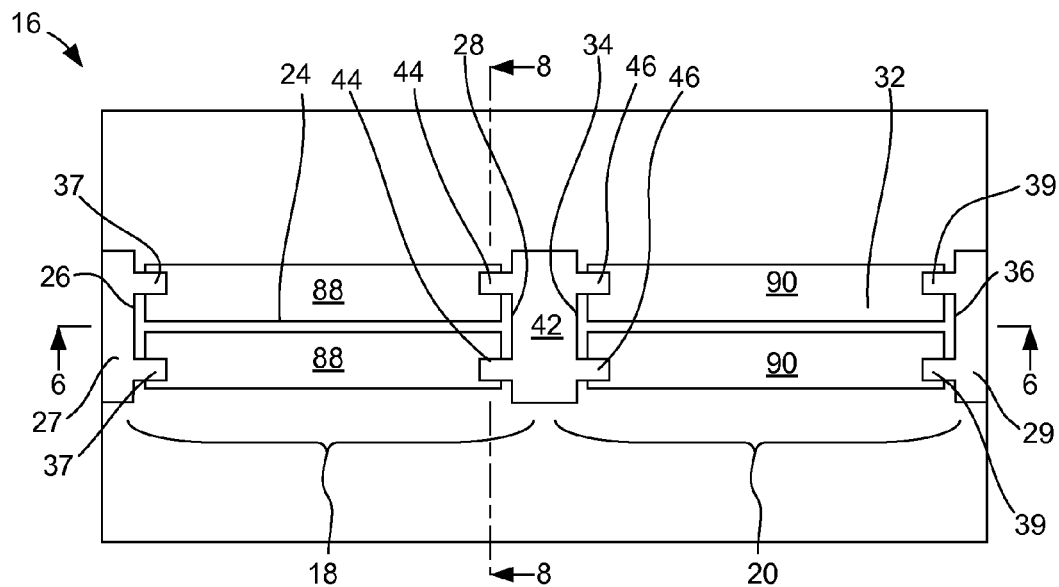
FIG. 5 is a top plan view of the etched-facet laser structure of FIG. 4.

Promoting good metal adhesion is a first advantage of the above-described single-layer optical coating over conventional multi-layer optical coatings (FIGS. 1-3). A second advantage is that parasitic capacitance, which is related to the total thickness of dielectric material on the ridge waveguide, can be controlled independently of the optical coating thickness. A third advantage is that the optical coating thickness on the etched facets can be more precisely controlled if only a single optical coating layer is applied than if multiple optical coating layers are applied, since each successive layer application (e.g., in a PECVD system) contributes an error tolerance.

Figure 22:
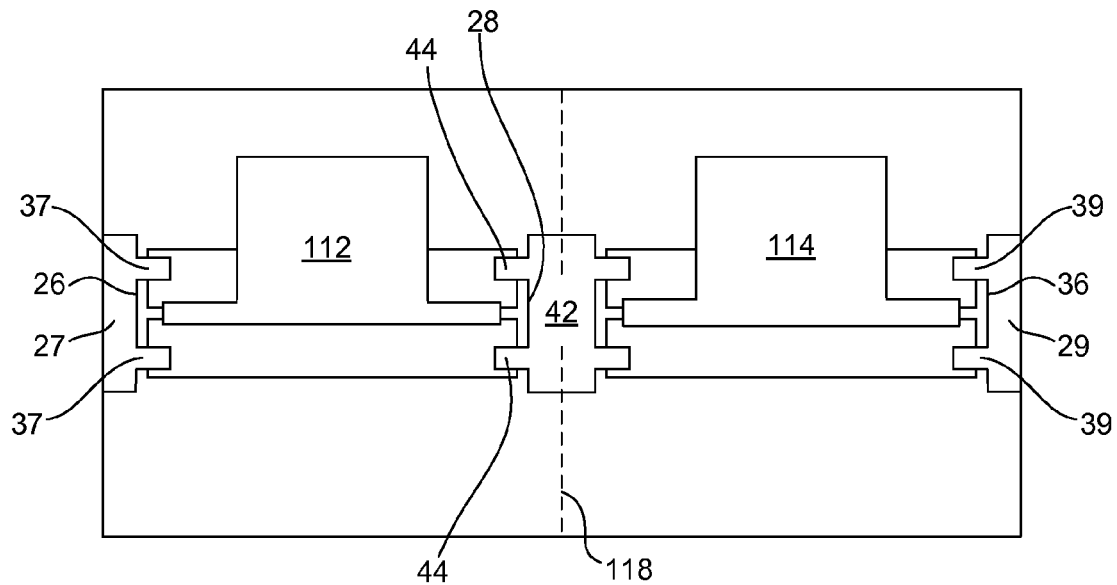
FIG. 22 is a schematic top plan view illustrating separating an etched-facet laser structure from another such structure.
Figure 23:
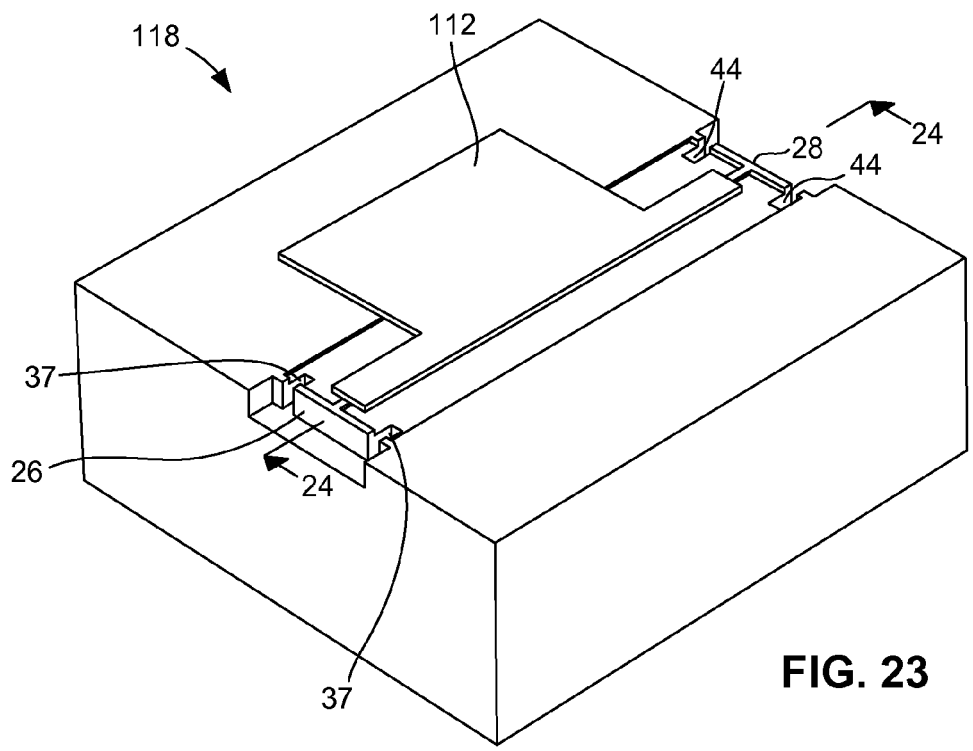
FIG. 23 is a perspective view of the etched-facet laser structure of FIG. 22.
Figure 24:
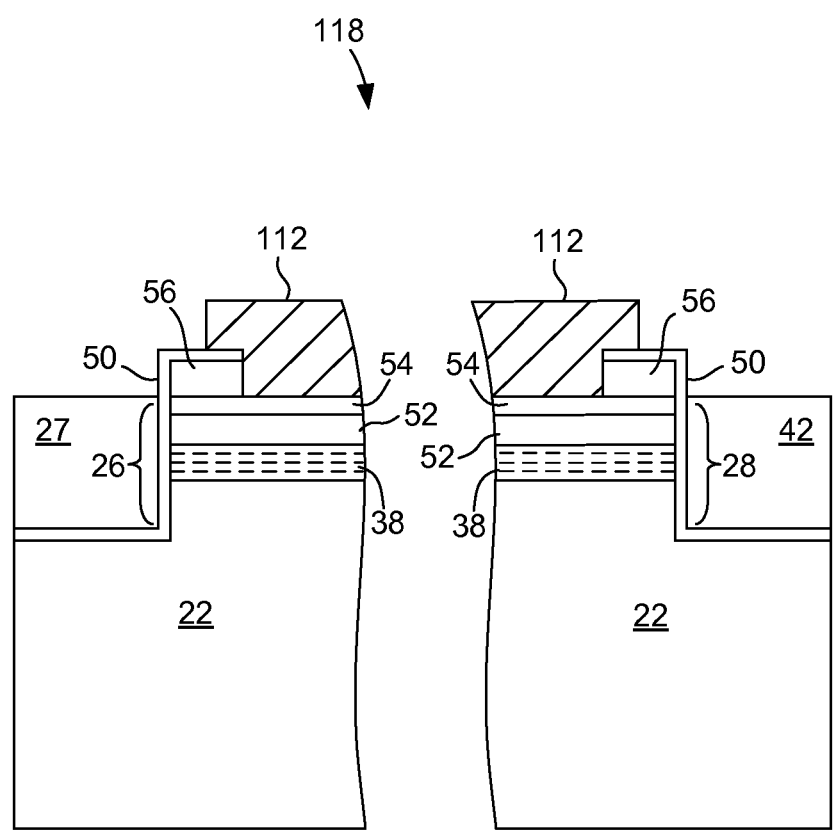
FIG. 24 is a sectional view along line 24-24 of FIG. 23.

Further processing can be in accordance with conventional techniques well understood by persons skilled in the art. For example, as illustrated by block 116, and with further reference to FIGS. 22-24, the semiconductor wafer (not shown in its entirety for purposes of clarity) can be diced or cut apart on a line 118 through the center of window 42 and similar H-shaped windows to separate out a single etched-facet laser 118. Note in FIG. 24 that metal region 112 extends down through an opening in optical coating 50 and mask layer 56, such that metal region 112 contacts InGaAs layer 54 of the ridge waveguide.

One or more illustrative embodiments of the invention have been described above. However, it is to be understood that the invention is defined by the appended claims and is not limited to the specific embodiments described.

What is claimed is:

1. A method for fabricating an edge-emitting optical semiconductor device, comprising:
   forming a first multiple quantum well (MQW) region on a substrate;
   forming a first mask over the first MQW region, the first mask defining a first ridge waveguide region extending in substantially a longitudinal direction between a first waveguide first end and a first waveguide second end;

forming a first ridge waveguide corresponding to the first ridge waveguide region;

forming a second mask consisting of a single dielectric material directly on the first ridge waveguide;

performing a removal process through the second mask to remove portions of the first MQW region and substrate to produce a window extending in a depth direction from the first ridge waveguide to the substrate and through the first MQW region, the window defining a first waveguide etched end facet;

applying an optical coating directly on the second mask and directly on the window to coat the first waveguide etched end facet, the optical coating consisting of no more than one layer of the dielectric material of the second mask;

etching a first contact opening through the optical coating and the second mask to expose the first ridge waveguide; and applying a first metal region in contact with a portion of the first ridge waveguide exposed through the first contact window.

2. The method of claim 1, wherein:

the dielectric material of the second mask consists of SiNx; and the optical coating consisting of no more than one layer of SiNx.

3. The method of claim 1, wherein:

the method further comprises forming a second MQW region on a substrate and forming a second ridge waveguide corresponding to a second ridge waveguide region, wherein the first mask is further formed over the second MQW region and further defines the second ridge waveguide region extending in substantially the longitudinal direction between a second waveguide first end and a second waveguide second end;

the removal process removes portions of the second MQW region and substrate, and the window defines the first waveguide etched end facet at the first waveguide second end and a second waveguide etched end facet at the second waveguide first end;

applying an optical coating directly on the second mask and directly on the window to coat the first waveguide etched end facet further coats the second waveguide etched end facet; and the method further comprises etching a second contact window through the optical coating to expose the second ridge waveguide, and applying a second metal region in contact with a portion of the second ridge waveguide exposed through the second contact window.

4. The method of claim 3, wherein the window has an "H" shape defined by a first pair of alcoves and a second pair of alcoves opposite the first pair of alcoves, the first waveguide etched end facet extending between the first pair of alcoves, and the second waveguide etched end facet extending between the second pair of alcoves.

5. The method of claim 1, wherein the substrate comprises a semiconductor material.

6. The method of claim 1, wherein forming a first mask over the first MQW region further comprises:

forming a first mask layer over the first MQW region, and performing lithography and dry-etch on the first mask layer to define the first ridge waveguide region.

7. The method of claim 6, wherein forming a first ridge waveguide corresponding to the first ridge waveguide region comprises:

performing a wet chemical etch on the first mask.

8. The method of claim 1, wherein forming a second mask consisting of a single dielectric material directly on the first ridge waveguide comprises:

forming a second mask layer consisting of the single dielectric material on the first ridge waveguide, and performing lithography and dry-etch on the second mask layer.

9. The method of claim 1, wherein the removal process through the second mask comprises an inductively coupled plasma process.

10. The method of claim 1, wherein the first metal region comprises an electrical contact pad of a laser.

11. A method for fabricating a laser semiconductor device of an optical transceiver, comprising:

forming a first multiple quantum well (MQW) region on a substrate;

forming a first mask over the first MQW region, the first mask defining a first ridge waveguide region;

forming a first ridge waveguide corresponding to the first ridge waveguide region;

forming a second mask consisting of a single dielectric material directly on the first ridge waveguide;

performing a removal process through the second mask to remove portions of the first MQW region and substrate to produce a window extending in a depth direction from the first ridge waveguide to the substrate and through the first MQW region, the window defining a first waveguide etched end facet;

applying an optical coating directly on the second mask and directly on the window to coat the first waveguide etched end facet, the optical coating consisting of no more than one layer of the dielectric material of the second mask;

etching a first contact opening through the optical coating and the second mask to expose the first ridge waveguide; and applying a first metal region in contact with a portion of the first ridge waveguide exposed through the first contact window.

12. The method of claim 11, wherein:

the dielectric material of the second mask consists of SiNx; and the optical coating consisting of no more than one layer of SiNx.

13. The method of claim 11, wherein the first ridge waveguide region extends in substantially a longitudinal direction between a first waveguide first end and a first waveguide second end.

14. The method of claim 13, wherein:

the method further comprises forming a second MQW region on a substrate and forming a second ridge waveguide corresponding to a second ridge waveguide region, wherein the first mask is further formed over the second MQW region and further defines the second ridge waveguide region;

the removal process removes portions of the second MQW region and substrate, and the window defines the first waveguide etched end facet at the first waveguide second end and a second waveguide etched end facet at the second waveguide first end;

applying an optical coating directly on the second mask and directly on the window to coat the first waveguide etched end facet further coats the second waveguide etched end facet; and the method further comprises etching a second contact window through the optical coating to expose the second ridge waveguide, and applying a second metal region in contact with a portion of the second ridge waveguide exposed through the second contact window.

15. The method of claim 14, wherein the second ridge waveguide region extends in substantially a longitudinal direction between a second waveguide first end and a second waveguide second end.

16. The method of claim 15, wherein the window has an "H" shape defined by a first pair of alcoves and a second pair of alcoves opposite the first pair of alcoves, the first waveguide etched end facet extending between the first pair of alcoves, and the second waveguide etched end facet extending between the second pair of alcoves.

17. The method of claim 13, wherein forming a first mask over the first MQW region further comprises:

forming a first mask layer over the first MQW region, and performing lithography and dry-etch on the first mask layer to define the first ridge waveguide region.

18. The method of claim 17, wherein forming a first ridge waveguide corresponding to the first ridge waveguide region comprises:

performing a wet chemical etch on the first mask.

19. The method of claim 13, wherein forming a second mask consisting of a single dielectric material directly on the first ridge waveguide comprises:

forming a second mask layer consisting of the single dielectric material on the first ridge waveguide, and performing lithography and dry-etch on the second mask layer.

20. The method of claim 13, wherein the removal process through the second mask comprises an inductively coupled plasma process.

* * * * *